(12) United States Patent
Parks (10) Patent No.: US 6,208,535 B1
(45) Date of Patent: Mar. 27, 2001

(54) RESONANT GATE DRIVER

(75) Inventor: David B. Parks, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/331,435

(22) Filed: Oct. 31, 1994

(51) Int. Cl.[7] .................................................. H02M 3/335
(52) U.S. Cl. ............................................................. 363/26
(58) Field of Search .............................. 363/22, 24, 26; 327/407, 408, 409

(56) References Cited

U.S. PATENT DOCUMENTS

| | | | |
|---|---|---|---|
| 5,140,201 | * 8/1992 | Uenishi | 307/571 |
| 5,264,736 | * 11/1993 | Jacobson | 307/246 |
| 5,265,003 | * 11/1993 | Kayser et al. | 363/131 |
| 5,296,765 | * 3/1994 | Williams et al. | 307/572 |
| 5,328,845 | * 7/1994 | Takahashi | 326/66 |

* cited by examiner

Primary Examiner—Matthew Nguyen
(74) Attorney, Agent, or Firm—Carlton H. Hoel; W. James Brady; Frederick J. Telecky, Jr.

(57) ABSTRACT

A power supply (500) with vertical field effect transistor synchronous rectifiers (VFET1 and VFET2) having drivers (VFET Driver1 and VFET Driver2) which provide bipolar mode of operation by diode clamping an inductor overshoot which forwards biases the gate-source junction. The rectifiers have low on resistance useful in low output voltage power supplies.

6 Claims, 8 Drawing Sheets

RESONANT GATE DRIVER

CROSS-REFERENCE TO RELATED APPLICATIONS

The following coassigned U.S. Patent application discloses related subject matter: Ser. Nos. 08/159,353, filed Nov. 29, 1993.

GOVERNMENT CONTRACT

This invention was made with Government support under Contract No. N66001-91-C-6008 awarded by the Department of the Navy. The government has certain rights in this invention.

BACKGROUND OF THE INVENTION

The invention relates to electronic devices, and, more particularly, to junction field effect transistor drivers.

Electronic components, such as integrated circuits and displays, typically have power requirements which differ from the primary power supply characteristics. For example, portable computers may contain integrated circuits operating with a 3.3 volt DC supply and a backlit display screen operating at 1500 volts but the primary power consists of rechargeable batteries whose output voltage at full charge may be 5 volts and which drops exponentially as the batteries are discharged. Hence, electronic systems typically will include power supplies with AC-DC converters, DC-DC regulators, or DC-AC inverters to provide output power with the required characteristics.

Figure 1A:
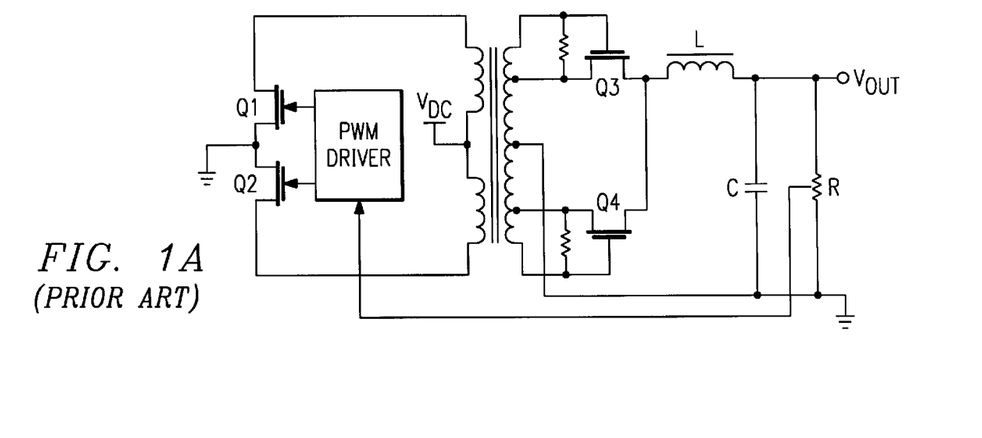
FIGS. 1a–c show known power switching circuitry and waveforms.
Figure 1B:
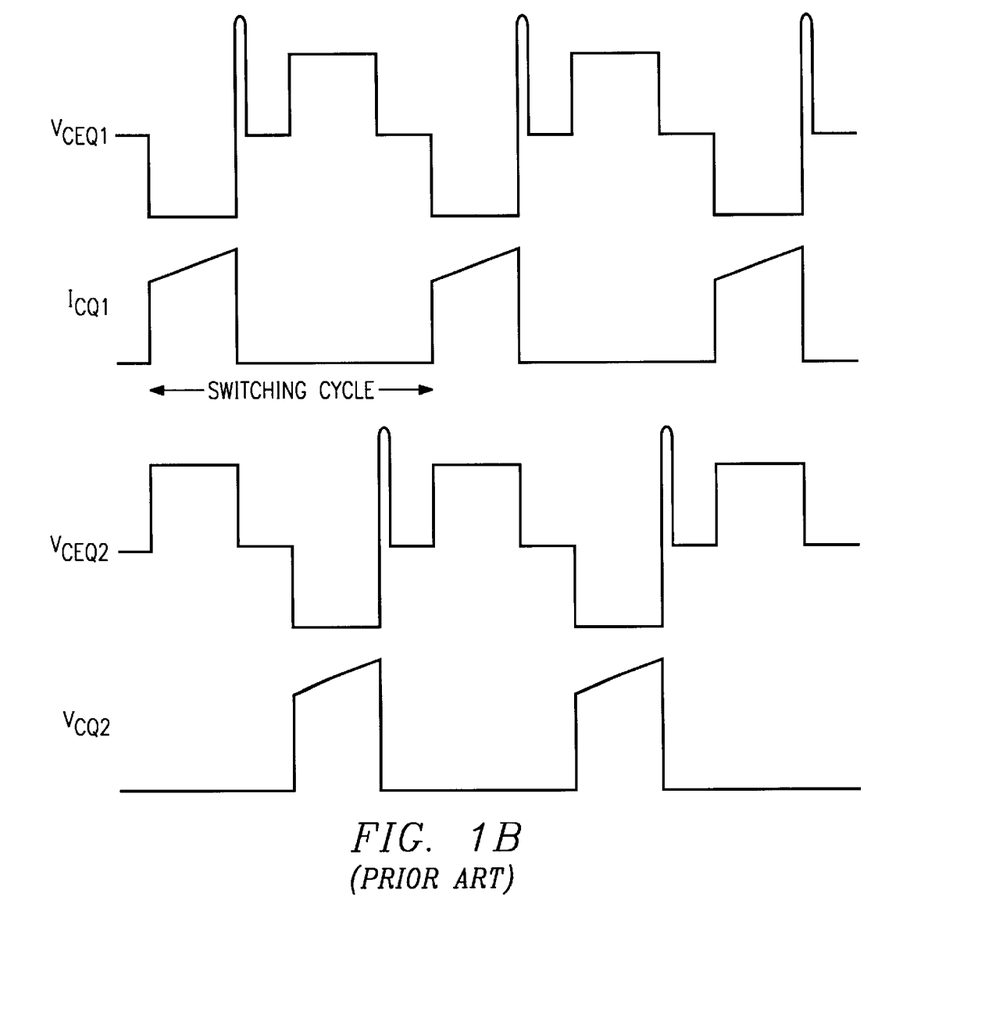
Figure 1C:
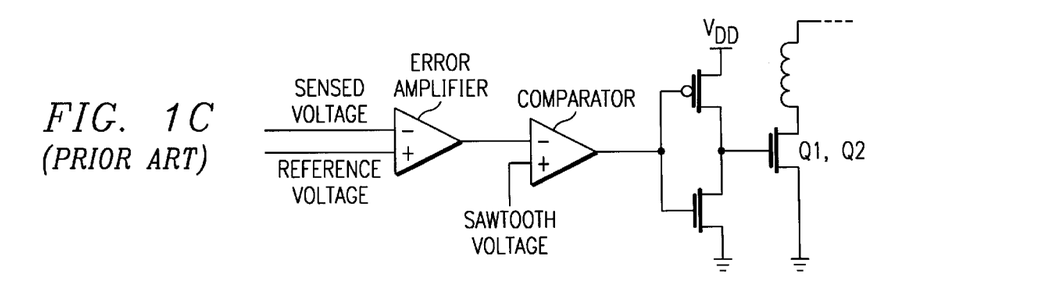

DC-DC regulators most commonly utlilize switching regulation and may use a push-pull arrangement as illustrated in FIG. 1a with waveforms shown in FIG. 1b. Basically, the pulse width modulated (PWM) driver alternately switches on and off power devices Q1 and Q2 to excite the transformer primary, and the transformer secondary feeds a self-commutating synchronous rectifier followed by an LC filter for output. The synchronous rectifier uses n-channel MOSFETs rather than diodes; this avoids the turn on voltage drop of diodes which can be significant for low output voltage power supplies. Resistor divider R senses the output voltage and feeds this back to the PWM driver. If the output voltage is too low, then the PWM driver increases the duty cycles of Q1 and Q2, and conversely, if the output voltage is too high, the duty cycles of Q1 and Q2 are reduced. The PWM driver may simply be an error amplifier (amplifying the difference between desired and actual output voltages) feeding one input of a comparator with a sawtooth voltage having a fixed frequency feeding the other comparator input; the comparator output would be the input signal for a driver for power device Q1 and a similar phase-shifted comparator would be the input signal for a driver for power device Q2. FIG. 1c illustrates such a possible half of a PWM driver.

Switching power supplies for portable computers and other portable electronic equipment generally benefit from higher switching frequencies because the size and weight of the magnetic portions (transformers and inductors) can be reduced. And the trend towards lower operating voltages for integrated circuits to reduce power consumption requires the output rectifiers of related power supplies have low on resistance and minimal voltage drop.

Junction field effect transistors (JFETs) typically are depletion mode devices with n-type channels and require a negative gate voltage to pinch off the channel and turn off. Thus the driver for a JFET also requires a negative power supply. Further, injecting carriers from the gate of a JFET into the channel while the JFET is turned on can lower the channel and drift region resistance ($R_{ON}$) and thereby minimizes ohmic losses. This "bipolar mode" of operation requires a small positive voltage to forward bias the gate, and so the JFET driver would further require a small positive power supply. See Baliga, Modern Power Devices pp.175–182 (Krieger Publ., Malabar, Fla. 1992). Thus the known drivers for JFET devices have problems including inefficient circuitry.

Figure 2A:
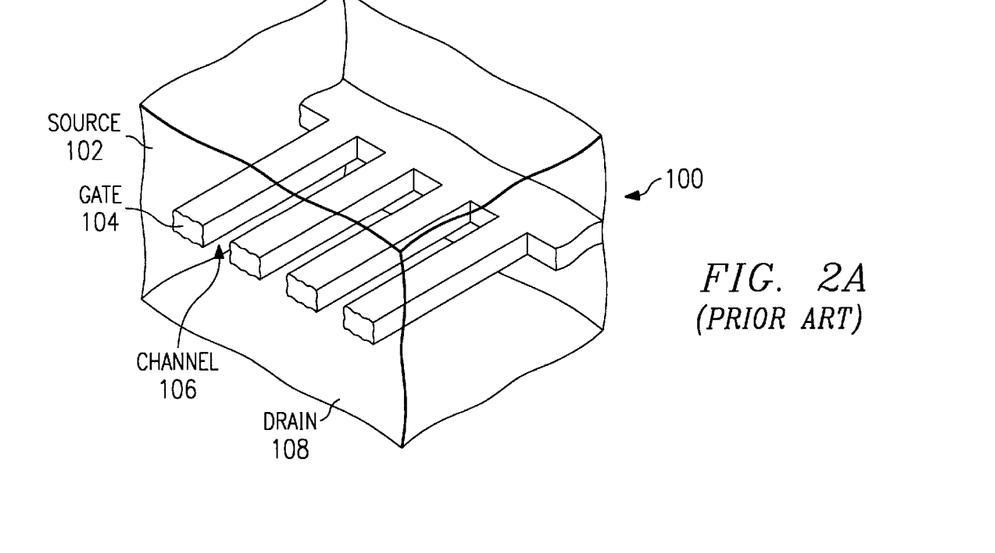
FIGS. 2a–b illustrate a known vertical junction field effect transistor.
Figure 2B:
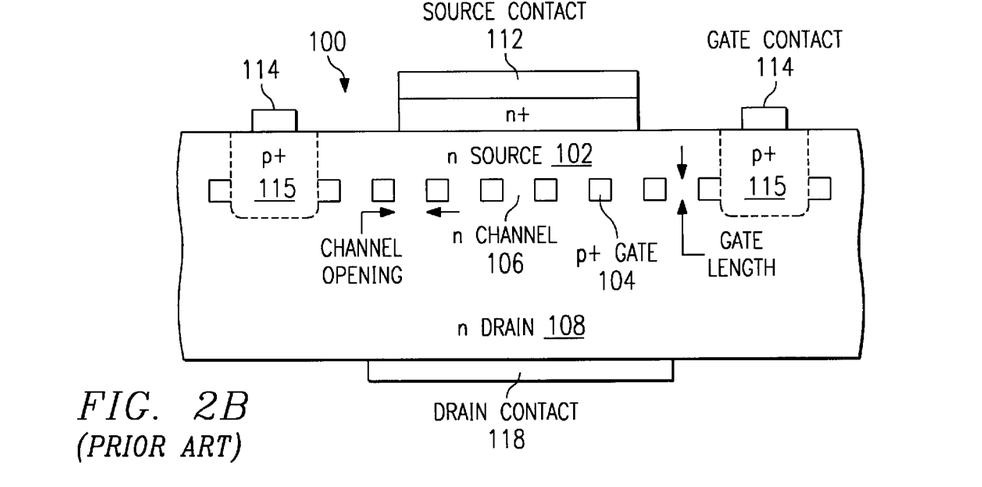

JFETs made be made of gallium arsenide to lower $R_{ON}$ due to the higher electron mobility of gallium arsenide as compared to silicon. JFETs frqeuently have a vertical channel structure and thus may be called VFETs. FIGS. 2a–b heuristically illustrate in perspective and cross sectional elevation views VFET 100 as including a source 102, multifinger gate 104, channel region 106 between the gate fingers, drain 108, source contact 112, gate contact 114, and drain contact 118. U.S. Pat. No. 5,231,037 describes a method of fabrication for such VFETs.

SUMMARY OF THE INVENTION

The present invention provides a resonant switching for a field effect transistor and associated circuits such as power supplies with synchronous output rectifiers. The resonant switching for a junction field effect transistor invokes bipolar mode operation with a diode clamping of the gate.

This has the advantage of yielding bipolar mode operation without a separate bias power supply.

BRIEF DESCRIPTION OF THE DRAWINGS

The drawings are schematic for clarity.

DESCRIPTION OF THE PREFERRED EMBODIMENTS

First preferred embodiment overview

Figure 3:
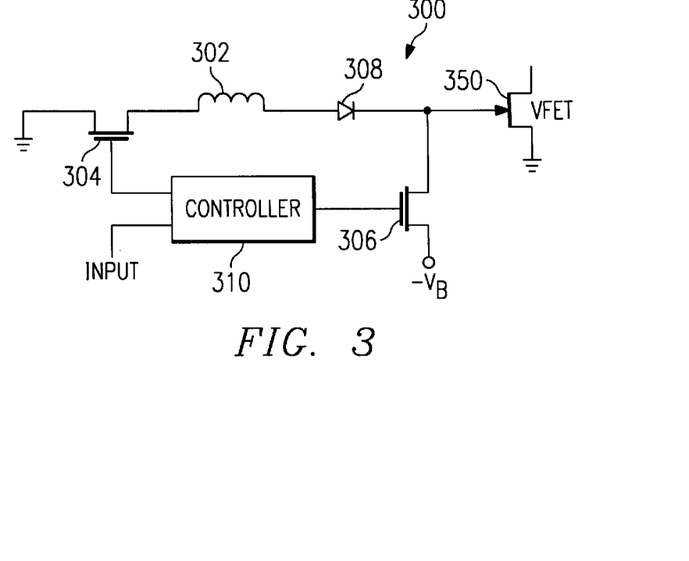
FIG. 3 is a circuit diagram of a first preferred embodiment driver.

FIG. 3 shows in schematic view first preferred embodiment driver, generally denoted by reference numeral 300, connected to drive the gate of vertical channel junction field effect transistor (VFET) 350. Driver 300 switches VFET 350 off and on by charging and discharging its gate. Indeed, the DC-DC converter of FIG. 1a could be constructed with synchronous rectifier transistors Q3 and Q4 as VFETs with gate drivers 300. In this case the timing for the controllers 310 could derive from the PWM.

Driver 300 includes inductor 302, switches 304 and 306, and diode 308. Controller 310 opens and closes switches 304 and 306 to alternately apply $-V_B$ and a small positive voltage to the gate of VFET 350. External input signals to controller 310 determines the timing for the switching, and inductor 302 provides a resonant charging of the gate of VFET 350 by forming a series LC circuit with the gate-tosource capacitance of VFET 350. With ground (or a small positive voltage) applied to its gate, VFET 350 turns on; and with the negative voltage $-V_B$ applied to its gate, VFET 350 turns off (is in a blocking state). The resonant VFET gate charging has two advantages: it avoids some power dissipation during charging and it provides a small positive gate charge to increase the conductivity of the VFET channel ("bipolar mode" of operation). Diode 308 holds the positive charge on the gate.

Driver operation

Figure 4:
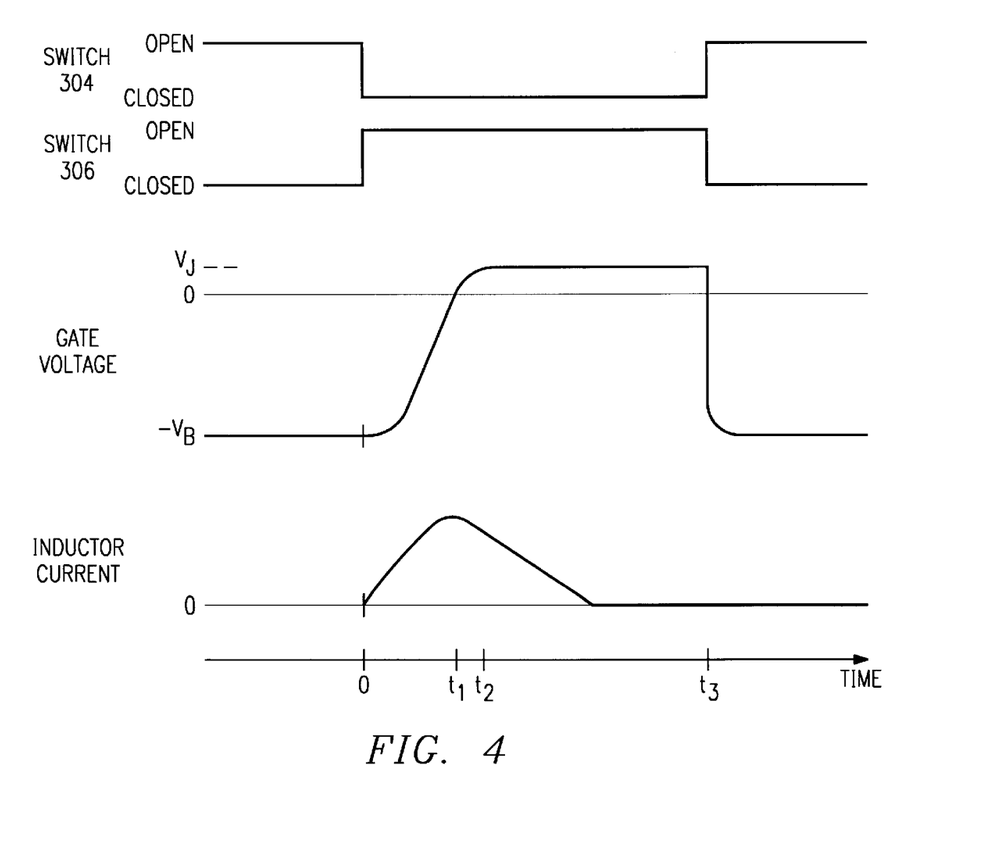
FIG. 4 shows the timing for the operation of the embodiment of FIG. 3.

FIG. 4 is a timing diagram illustrating the operation of driver 300. The upper portion of FIG. 4 shows the timing of the signals from controller 310 to open and close switches 304 and 306 of driver 300, and lower portion of FIG. 4 shows the voltage on the gate of VFET 350 and the current through inductor 302. In particular, presume that just prior to time 0 switch 304 is open and switch 306 is closed; thus voltage $-V_B$ applies to the gate of VFET 350 and puts VFET 350 into its blocking state. Then at time 0 controller 310 closes switch 304 and opens switch 306, this applies the ground voltage to the series LC circuit made of inductor 302 in series with diode 308 and the input capacitance of the gate of VFET 350. This input capacitance consists primarily of the gate-to-source capacitance and initially has a charge of $-V_B$. Thus ignoring the voltage drop across diode 308, the current I through inductor 302 which charges the gate capacitance initially has the form $$I(t)=V_B\sqrt{(C/L)}\sin[t/\sqrt{(LC)}]$$

where C is the gate capacitance and L is the inductance of inductor 302.

Similarly, the voltage on the gate of VFET 350 initially rises as $$V(t)=-V_B \cos[t/\sqrt{(LC)}]$$

and reaches 0 at time $t_1$ in FIG. 4; at this time VFET 350 is turning on. The rise time $t_1$ equals $\pi\sqrt{(LC)}/2$; so with a given gate capacitance C for VFET 350, choose the inductance L to achieve a desired rise time. For example, to achieve a rise time of 50 nanoseconds with a power VFET having an input gate capacitance of 2000 pF, choose inductor 302 to have an inductance of 0.1 $\mu$H. With $V_B$ equal to 3 volts, the maximum inductor current would be about 0.5 amp. Thus a fairly small inductor for operating voltages of roughly 5 volts suffices.

In FIG. 4, at time $t_2$ the gate voltage of VFET 350 has gone positive to forward bias the gate-source junction and shunt the inductor current to ground; that is, the gate voltage overshoots ground and goes positive due to the induced voltage from the inductor's magnetic field collapse. This clamps the gate voltage at $V_J$, typically about 0.8 volt for a VFET made of gallium arsenide, and the inductor current linearly decays toward 0 while diode 308 and the gate-to-source capacitance holds the gate voltage positive. That is, VFET 350 operates in "bipolar mode" without a separate power supply for the gate bias. Furthermore, the gate bias $V_J$ is self-adjusting.

At time $t_3$ controller 310 opens switch 304 and closes switch 306 to turn off VFET 350. Closing switch 306 connects the $-V_B$ supply directly to the gate of VFET 350 and rapidly charges it to $-V_B$ to turn off VFET 350.

The net effect of the on/off cycle with driver 300 switching VFET 350 is a small positive bias on the VFET gate during turn on and thus bipolar mode operation without a separate positive bias power supply for the gate; rather a passive overshoot circuit (inductor) induces the desired voltage from the switching current charging the gate capacitance.

The parameters such as the inductance L and resistance of inductor 302, the current hnadling of switches 304 and 306 and of diode 308, and the blocking voltage $-V_B$ supply will depend upon the characteristics of VFET 350 and the desired switching speed. The capacitance C of the gate and the on resistance $R_{ON}$ when clamped at $V_J$ of VFET 350 will depend upon the circuit requirements including the frequency of switching and current draw.

For a VFET of opposite doping type where a blocking gate voltage would be positive and a bipolar mode gate voltage would be small negative, the extrenal supply would be at $+V_B$ and the inductor-induced voltage overshoot would apply in the same manner to yield a negative gate bias.

Controller

Generally, controller 310 in FIG. 3 need be no more than a conduit for the input signal to open and close the switches 304 and 306. With inductor current 302 peaking at about 0.5 amp and the peak current through switch 306 quite large due to minimal series resistance, switches 304 and 306 may be fairly large and controller 310 may just consist of buffers to drive the switches.

FIG. 3 shows switches 304 and 306 as MOS field effect transistors, although any other type switch could be used. However, with MOS switches, controller 310 may be integrated with the $-V_B$ negative power supply (which could be a large capacitor charged by a charge pump) and provide a compact package including all of the components except inductor 302. Indeed, the MOS switches could be one NMOS and one PMOS with the NMOS built in a well biased at $-V_B$.

Preferred embodiment power supply

Figure 5:
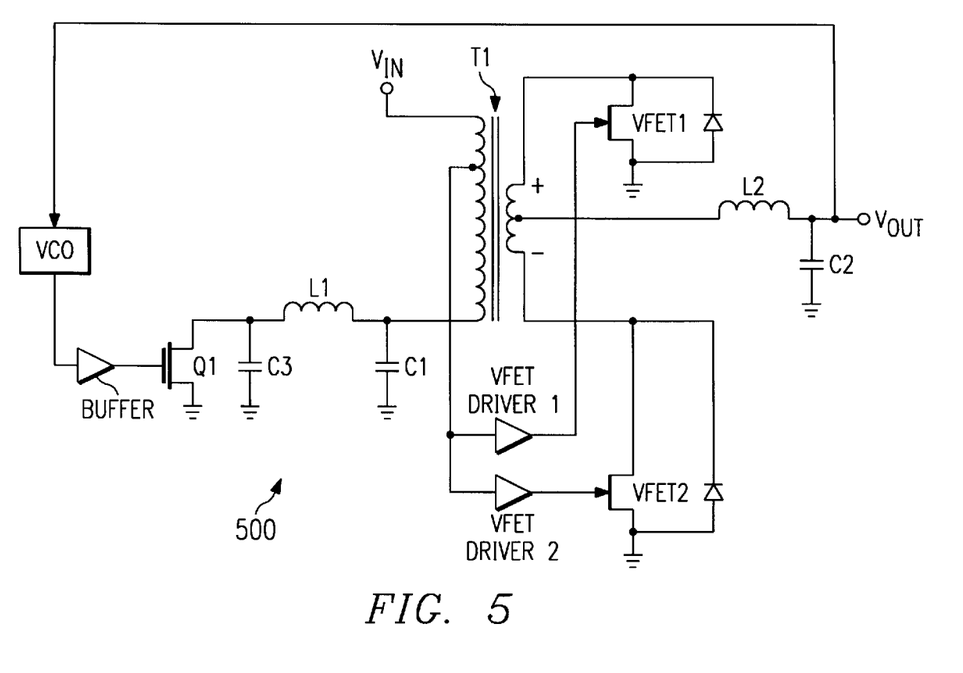
FIG. 5 shows a circuit diagram for a preferred embodiment power supply.

FIG. 5 schematically shows preferred embodiment power supply 500 as including inductor L1 and capacitors C1 and C3 plus switching power MOSFET Q1 between a dc supply $V_{IN}$ and ground with transformer T1 to couple power to a secondary circuit having VFET synchronous rectifiers with VFET drivers analogous to driver 300. The output has low pass filter (inductor L2 and capacitor C2) and drives a voltage controlled oscillator (VCO) which drives power MOSFET Q1. When Q1 switches closed, current resonantly builds up in inductor L1, and when Q1 opens the current resonantly collapses to 0. This provides varying current in the transformer primary winding to excite the transformer secondary winding with alternating polarity.

Power supply 500 operates as follows. VCO has a free-running oscillation frequency of about 1 MHz and outputs a square wave. The VCO output drives the MOSFET Q1 gate buffer to switch Q1 between off and on at about 1 MHz. This yields a current through inductor L1 and transformer T1 primary which alternately increases and decreases and excites a changing polarity voltage in the secondary winding of T1. When the polarity is as shown in FIG. 5, VFET Driver1 has VFET1 in the blocking state and VFET Driver2 has VFET2 in the on state; whereas, when the polarity is the reverse of that shown in FIG. 5, the drivers have VFET1 on and VFET2 blocking. Thus the VFETs provide full wave rectification. Further, the VFETs have minimal voltage drop because of their low on-resistance in the bipolar mode due to the VFET drivers. A tap from the primary winding of transformer T1 sets the timing for the VFET drivers by sensing the polarity of the voltage across the primary winding.

If the output voltage $V_{OUT}$ differs from the desired voltage, VCO changes its oscillation frequency to change the secondary winding voltage magnitude.

Figure 6A:
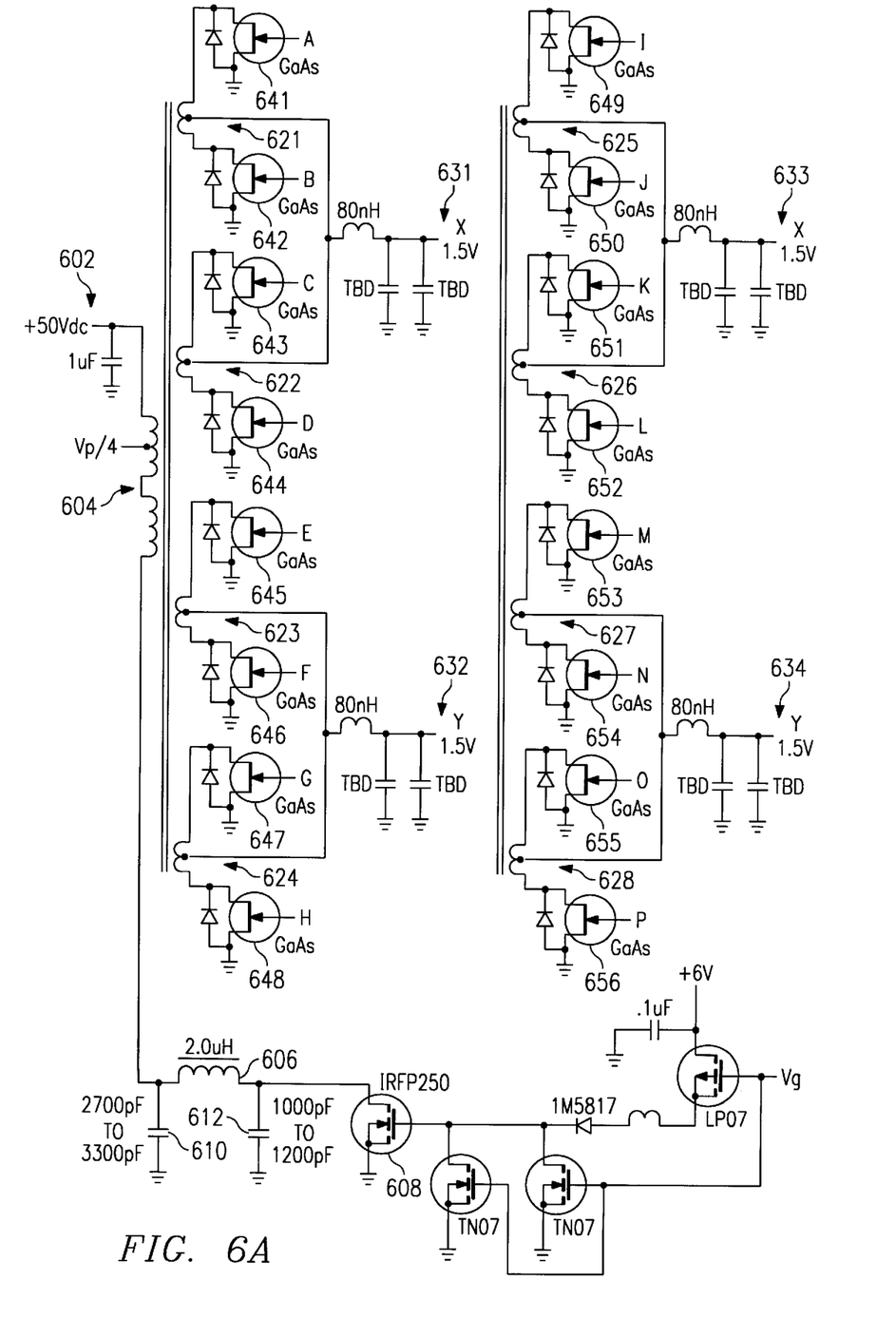
FIGS. 6a–d are circuit diagrams for another preferred embodiment power supply.
Figure 6B:
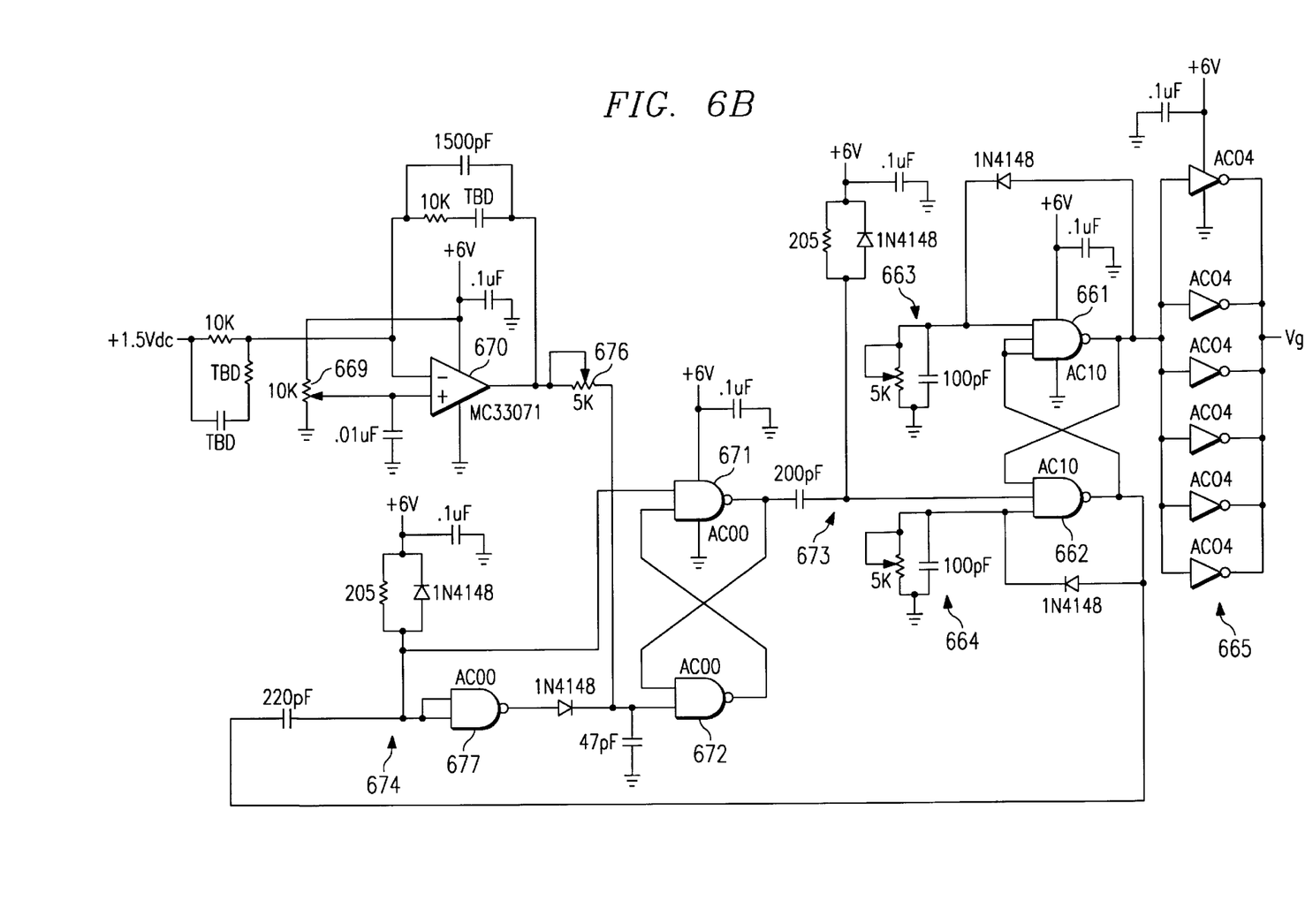
Figure 6C:
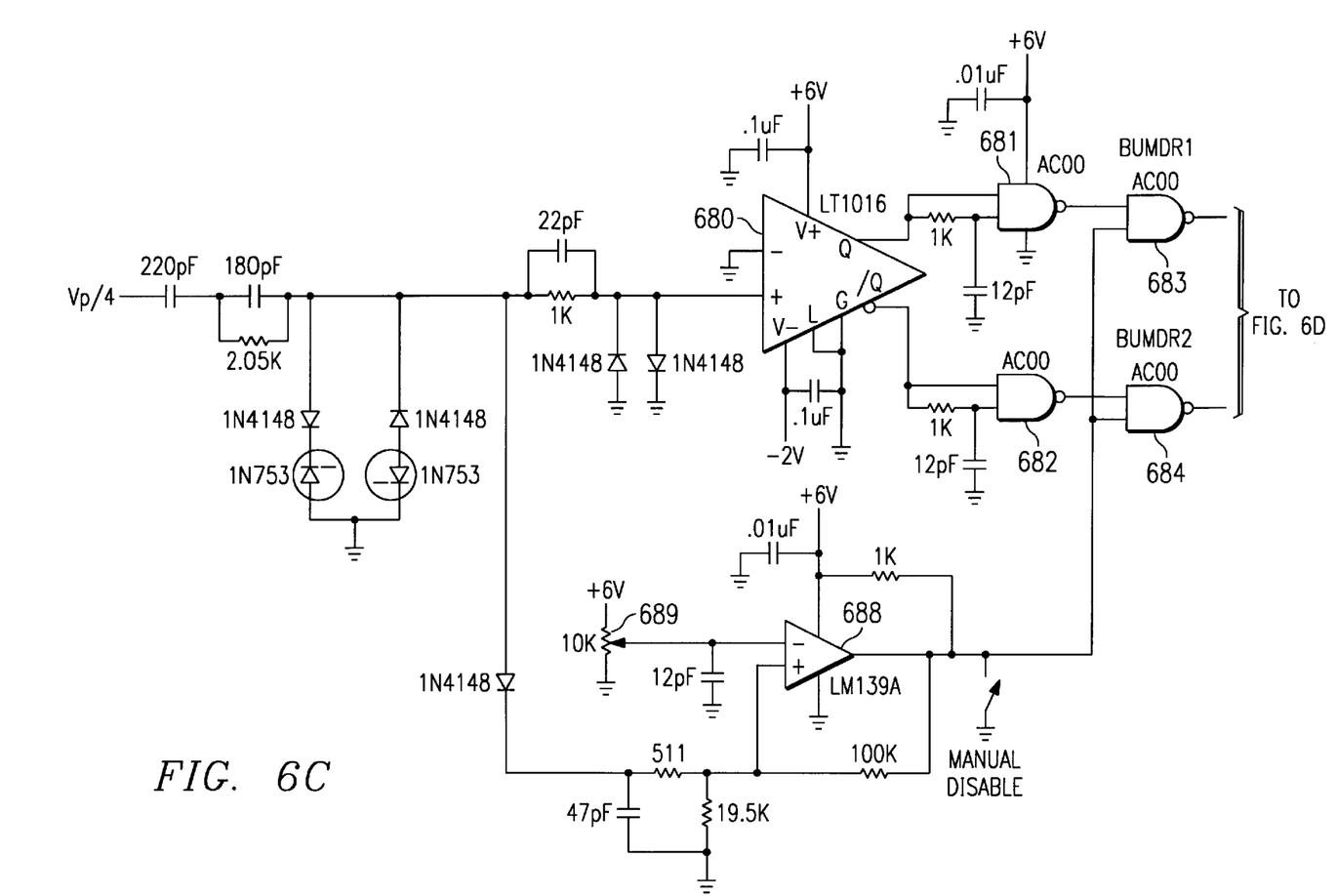

FIGS. 6a–c schematically show a second preferred embodiment power supply which is analogous to power supply 500. In particular, FIG. 6a illustrates transformer primary winding 604, inductor 606, and power MOSFET 608 connected in series between +50 volts dc source 602 and ground; capacitors 610 and 612 connected to inductor 606 provide the capacitance for the resonant current build up and collapse. Inductor 606 has an inductance of about 2.0 μH and capacitors 610 and 612 have capacitances of about 3000 pF and 1100 pF, respectively.

The transformer secondary consists of eight center-tapped windings 621–628 combined in parallel pairs for a total of four +1.5 volts dc outputs 631–634. Each of outputs 631–634 has a low pass filter (inductor plus capacitor), and each of the center-tapped secondary windings has the center tap connected to the corresponding low pass filter and each of the two terminals connected to a VFET connected to ground. The sixteen VFETs (641–656) have synchronous drivers (FIG. 6c) with the two VFETs in each pair driven to complementary states: one conducting and one blocking for full wave rectification. The VFET gate drive signals are labelleld A–P.

FIG. 6b shows the voltage controlled oscillator which switches power MOSFET Q1 off and on and adjusts its oscillation frequency according to feedback from the output +1.5 volts actual voltage. Cross-coupled NAND gates 661 and 662 form a latch, plus each NAND gate has its output feedback through a diode to an input RC pulldown circuit (663 and 664, respectively) which has a (manually adjustable) time constant of about 500 nsec. Thus the cross-coupled NAND gates form a square wave oscillator with a free running oscillation frequency of about 1 MHz. The output of the NAND gate oscillator drives inverters 655 which in turn drive (via p-channel and n-channel MOSFETs) the gate of power MOSFET Q1 to perform the current switching previously described. The righthand portion of FIG. 6b labels the output of inverters 665 as $V_G$, and the lefthand portion of FIG. 6a shows $V_G$ driving pullup a p-channel MOSFET and pulldown n-chnnel MOSFETs which connect to the gate of power MOSFET 608.

The voltage controlled oscillator of FIG. 6b adjusts its oscillation frequency depending on the +1.5 volts output at the transformer secondaries by inputting the +1.5 volts to the inverting input of opamp 670 while the direct input is set by adjustable resistor divider 669. The output of opamp 670 feeds an input of NAND gate 672, which with cross-coupled NAND gate 671 forms a latch, with the output of NAND gate 671 feeding (through an RC plus diode pullup circuit 673) an input of oscillator NAND gate 662. The output of oscillator NAND gate 662 feeds back (through RC plus diode pullup circuit 674) to the inputs of latch 671–672. RC plus diode pullup circuits 673 and 674 have time constants of about 50 nsec, so a high-to-low transition yields a low pulse of about 50 nsec and a low-to-high transition yields only a constant high. Thus when the +1.5 volts dc secondary output is greater than the voltage from resistor divider 669, comparator ?? outputs a low to NAND gate 672 through resistor 676. Then when oscillator NAND gate 662 makes a high-to-low transition, RC plus diode pullup circuit 674 passes a low 50 nsed pulse to NAND gate 671 and a high 50 nsec pulse to NAND gate 672 (resistor 676 provides the drop from the high of inverter 677 to the low sink of opamp 670). This sets and resets latch 671–672 to output a high pulse to RC plus diode pullup 673 and thus a 50 nsec low pulse to an input of NAND gate 662. This switches NAND gate 662 back high, and thereby shortens the usual 500 nsec low for NAND gate 662 to 50 nsec: changes the oscillation frequency and lessens the current buildup and collapse in inductor 606 and thus lessens the secondary voltage and eventually the +1.5 volts output. Hence, the feedback stabilizes the +1.5 volts output.

Figure 6D:
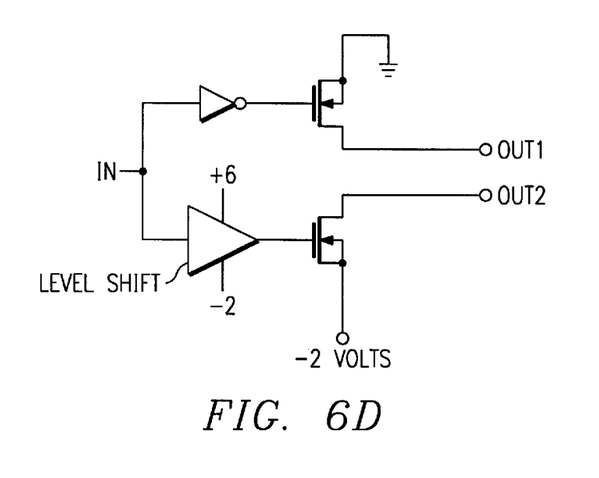

FIG. 6c shows the drivers for VFETs 641–656 which are synchronized with the polarity of the voltages of the transformer secondary windings 621–628 by the tap from transformer primary winding 604. FIG. 6a denotes the primary tap output as $V_P/4$ (i.e., the tap is across one quarter of the primary winding), and FIG. 6c shows $V_P/4$, after passing a dc blocking capacitor and positive and negative limiting diodes, driving the direct input of comparator 680 with the inverting input at ground. NAND gate 681 inverts the direct output of comparator 680 with a delay for low-to-high transitions, and NAND gate 682 inverts the complementary output of comparator 680 also with a delay for low-to-high transitions. The direct and complementary outputs of comparator 680 are then (when comparator 688 outputs a high) are inverted again by the NAND gates 683 and 684, respectively, and become the inputs for VFET drivers 691–692 and 693–694, respectively. Drivers 691–694 all have the same structure, and FIG. 6d illustrates this structure in simplified form. In particular, when the input is high, the OUT2 output connects to the negative power supply (−2 volts) and the OUT1 output floats; whereas, when the input is low, OUT1 connects to ground and OUT2 floats. The level shifter insures turn off of the NMOS connected to the −2 supply.

As shown in FIG. 6c, the OUT2 output connects directly to a VFET gate and the OUT1 output connects through an inductor and diode to a VFET gate. Thus this has the same functionality as the circuit of FIG. 3, and the inductor plus diode provide the resonant positive VFET gate voltage for bipolar mode of operation.

In each of the transformer secondary windings 621–628 one of the VFET gates (labelled A, C, E, G, I, K, M, and O) is driven by drivers 691–692 and the other VFET gate (labelled B, D, F, H, J, L, N, and P) is driven by drivers 693–694. Thus when comparator 688 outputs a high, the drivers 691–692 have outputs opposite the outputs of drivers 693–694 and full wave rectification of the voltages induced in the secondary windings occurs with the bipolar mode VFET providing a minimal voltage drop.

When comparator 688 provides a low output, all four drivers 691–694 has a high input, so −2 volts applies to all VFET gates and all VFETs are in a blocking state. Thus the voltages induced in the secondary windings are rectified by the diodes paralleling the VFETs. Comparator 688 has a low output when the magnitude of the swings in $V_P/4$ are too small to switch comparator 688 into a high output; adjustable resistor 689 sets the threshold for this switching.

Fabrication

The preferred embodiments may be assembled from discrete components or the noninductor/transformer components could be totally or partially fabricated as a silicon integrated circuit. The negative voltage may be supplied by a separate external power supply or by an on-chip charge pump. VFETs made of GaAs or other high mobility semiconductor materials may be discrete or integrated with diodes and small inductors; or integrated with silicon compoennts via heteroepitaxy.

Modifications

The preferred embodiments may be varied in many ways while retaining one or more of the features of a FET gate charging current leading to a voltage overshoot in a passive resonant circuit with a diode to hold the FET gate at a bipolar mode voltage.

For example, the two switches (connecting to the turn on gate voltage and to the blocking gate voltage) could have open and closed time intervals which are overlapping or separated; the resonantly driven FET could be a MOSFET or other insulated gate FET provided with a high breakdown gate dielectric or a gate-to-source bypass diode avoid gate dielectric breakdown, in this situation the two gate voltages may be $V_{SS}$ (typically ground) and $V_{DD}$ so that a boosted gate voltage (greater than $V_{DD}$) is obtained without a boost circuit; the resonant circuit (inductor and gate capacitance plus diode) could be varied such adding another capacitor in parallel with the gate capacitance, moving the diode to the other side of the inductor, inserting a second diode between ground and the inductor, providing a bypass diode from gate to source to limit the degree of bipolar operation, replacing the single inductor with several series or parallel or both inductors, omitting the diode if the switching frequency is high enough that the inductor collapse current keeps the FET in bipolar mode long enough, using other switches such as JFETs, MESFETs, bipolar transistors, and so forth; the materials the FET is made of can by varied, including heterojunction gates and ternary, quaternary or more element III-V semiconductor compounds; and the geometry of the JFET can be varied such as inclusion of a backgate.

What is claimed is:

1. A driver, comprising:
   (a) first and second power supply inputs;
   (b) an output;
   (c) a first switch directly between said first power supply input and said output;
   (d) a second switch coupled between said second power supply input and a passive overshoot circuit, said overshoot circuit coupled to said output; and
   (e) a switch input coupled to said first and second switches.

2. The driver of claim 1, wherein:
   (a) said overshoot circuit includes an inductor.

3. The driver of claim 2, wherein:
   (a) said overshoot circuit includes a diode in series with said inductor.

4. The driver of claim 2, wherein:
   (a) said first and second switches are field effect transistors on a common substrate.

5. A method of driving the gate of a field effect transistor, comprising the steps of:
   (a) providing first and second power supplies;
   (b) alternatively (i) coupling said first power supply directly to a gate of a field effect transistor and (ii) coupling said second power supply to said gate through a passive overshoot circuit;
   (c) whereby said first power supply may be at a voltage to turn off said field effect transistor.

6. The method of claim 5, wherein:
   (a) said overshoot circuit includes an inductor.

* * * * *